United States Patent
Lee et al.

(10) Patent No.: US 9,314,869 B2
(45) Date of Patent: Apr. 19, 2016

(54) METHOD OF RECOVERING A BONDING APPARATUS FROM A BONDING FAILURE

(75) Inventors: Wai Wah Lee, Singapore (SG); Jun Feng Li, Singapore (SG); Wei Boon Wong, Singapore (SG); Soo Kin Kenny Tan, Singapore (SG)

(73) Assignee: ASM Technology Singapore Pte. Ltd., Singapore (SG)

( * ) Notice: Subject to any disclaimer, the term of this patent is extended or adjusted under 35 U.S.C. 154(b) by 1115 days.

(21) Appl. No.: 13/350,363

(22) Filed: Jan. 13, 2012

(65) Prior Publication Data
US 2013/0180957 A1    Jul. 18, 2013

(51) Int. Cl.
*B23K 20/00* (2006.01)
*H01L 23/00* (2006.01)

(52) U.S. Cl.
CPC ............ *B23K 20/007* (2013.01); *H01L 24/78* (2013.01); *H01L 24/85* (2013.01); *H01L 24/48* (2013.01); *H01L 2224/48091* (2013.01); *H01L 2224/78268* (2013.01); *H01L 2224/78301* (2013.01); *H01L 2224/859* (2013.01); *H01L 2224/85181* (2013.01); *H01L 2224/85205* (2013.01); *H01L 2924/00014* (2013.01); *H01L 2924/01327* (2013.01); *H01L 2924/12036* (2013.01)

(58) Field of Classification Search
USPC ............ 156/94, 761–763; 219/69.2; 228/1.1, 228/2.1, 180.5, 101, 102, 103, 264; 438/4
See application file for complete search history.

(56) References Cited

U.S. PATENT DOCUMENTS

| | | | | |
|---|---|---|---|---|
| 3,507,033 | A * | 4/1970 | Coucoulas | 228/111 |
| 4,569,473 | A * | 2/1986 | Guiliano | 228/264 |
| 5,072,874 | A * | 12/1991 | Bertram et al. | 228/264 |
| 5,137,836 | A * | 8/1992 | Lam | 438/15 |
| 5,148,967 | A * | 9/1992 | Gabaldon et al. | 228/180.5 |
| 5,216,803 | A * | 6/1993 | Nolan et al. | 29/829 |
| 5,263,620 | A * | 11/1993 | Hernandez et al. | 225/1 |
| 5,425,833 | A * | 6/1995 | Fujimoto et al. | 156/765 |
| 5,601,675 | A * | 2/1997 | Hoffmeyer et al. | 156/94 |
| 5,615,821 | A * | 4/1997 | Sasano | 228/102 |
| 5,702,051 | A * | 12/1997 | Leicht | 228/234.2 |
| 5,757,073 | A * | 5/1998 | Hoffmeyer | 257/700 |
| 7,004,373 | B1* | 2/2006 | Miller | 228/103 |
| 7,044,182 | B2* | 5/2006 | Haraguchi | 156/351 |
| 7,712,649 | B2* | 5/2010 | Kuramochi | 228/103 |
| 2001/0002607 | A1* | 6/2001 | Sugiura et al. | 156/91 |
| 2005/0133563 | A1* | 6/2005 | Kim et al. | 228/4.5 |
| 2006/0011710 | A1* | 1/2006 | Lee et al. | 228/180.5 |

(Continued)

*Primary Examiner* — Dana Ross
*Assistant Examiner* — Renee L Miller
(74) *Attorney, Agent, or Firm* — Sughrue Mion, PLLC

(57) ABSTRACT

A method of recovering a bonding apparatus from a bonding failure to resume a normal operating state for semiconductor chip fabrication is disclosed. The bonding apparatus comprises: i) a bonding tool for bonding a wire between a semiconductor chip and a substrate; and ii) a position sensor. Specifically, the method comprises the steps of: a) the position sensor determining a position of the bonding tool when the bonding tool contacts a surface to bond the wire to the substrate; b) the bonding apparatus detecting a bonding failure caused by detachment of the semiconductor from the substrate based on the position of the bonding tool; and c) the bonding apparatus detaching the semiconductor chip from the wire.

15 Claims, 4 Drawing Sheets

(56) References Cited

U.S. PATENT DOCUMENTS

| | | | |
|---|---|---|---|
| 2007/0187138 A1* | 8/2007 | Takahashi et al. | 174/257 |
| 2007/0187467 A1* | 8/2007 | Toyama et al. | 228/101 |
| 2007/0187470 A1* | 8/2007 | Tei | 228/180.5 |
| 2007/0246513 A1* | 10/2007 | Tei et al. | 228/101 |
| 2009/0321501 A1* | 12/2009 | Liang et al. | 228/180.5 |
| 2010/0051670 A1* | 3/2010 | Okafuji | 228/102 |
| 2010/0155455 A1* | 6/2010 | Mii et al. | 228/102 |
| 2011/0278349 A1* | 11/2011 | Tei et al. | 228/111 |

\* cited by examiner

METHOD OF RECOVERING A BONDING APPARATUS FROM A BONDING FAILURE

TECHNICAL FIELD OF THE INVENTION

The present invention relates to a method of recovering a bonding apparatus during a bonding failure to resume a normal operating state for semiconductor chip fabrication.

BACKGROUND OF THE INVENTION

Bonding apparatus are used in semiconductor assembly and packaging. An example of a bonding apparatus is a wire bonder, which makes electrical wire connections between electrical contact pads of semiconductor chips and a substrate—a process which is known as wire bonding. Specifically, bonding wire is fed from a wire spool to a bonding tool (e.g. a capillary) to make the electrical wire connections between the semiconductor chips and the substrate during wire bonding.

One method of wire bonding uses a ball bond and involves a series of steps, as follows: i) melting a length of bonding wire held by the capillary to produce a free air ball; ii) lowering the free air ball to an electrical contact pad of a semiconductor chip; and iii) welding the free air ball to the substrate via a ball bond. The capillary then draws out a loop of the bonding wire starting from the ball bond and ending with a wedge bond to electrically connect the semiconductor chip with the substrate.

Before the wire bonding process begins, the semiconductor chip is bonded to the substrate using an adhesive die attach material such as epoxy. If the semiconductor chip has not been properly adhered to the substrate, the semiconductor chip may detach from the substrate during wire bonding to cause a bonding failure, especially when the capillary is drawing out a loop of the bonding wire to electrically connect the semiconductor chip with the substrate. In this case, the detached semiconductor chip would interfere with the wire bonding process and prevent the wire bonder from continuing its operation. This results in undesirable machine downtime of the wire bonder.

In order to recover the wire bonder from the bonding failure to resume a normal operating state for semiconductor chip fabrication, a technician has to manually remove the detached semiconductor chip from the wire bonder. In addition, the technician may be required to form a dummy bond between the bonding wire and the substrate, and to manually adjust a tail length of the bonding wire through the capillary, before the wire bonder can continue operating.

Thus, it is seen that the conventional way of recovering the wire bonder from the bonding failure is not just labour intensive, but also time-consuming. Such a solution naturally reduces the throughput capacity of the wire bonder for wire bonding.

Accordingly, it is an object of this invention to seek to provide a solution for recovering a bonding apparatus to resume a normal operating state for semiconductor chip fabrication in the event that a semiconductor chip is detached from a substrate during wire bonding.

SUMMARY OF THE INVENTION

A first aspect of the present invention is a method of recovering a bonding apparatus during a bonding failure to resume a normal operating state for semiconductor chip fabrication. The bonding apparatus includes: i) a bonding tool for bonding a wire between a semiconductor chip and a substrate, and ii) a position sensor. Specifically, the method comprises the steps of: i) the position sensor determining a position of the bonding tool when the bonding tool contacts a surface to bond the wire to the substrate; ii) the bonding apparatus detecting a bonding failure caused by detachment of the semiconductor chip from the substrate based on the position of the bonding tool; and iii) the bonding apparatus detaching the semiconductor chip from the wire.

By using a position sensor to determine the position of the bonding tool when in contact with a surface to bond the wire to the substrate, the presence of a bonding failure due to detachment of the semiconductor chip from the substrate can be automatically detected and resolved by the bonding apparatus, instead of relying on human effort. Thus, such a solution for recovering the bonding apparatus from the bonding failure to resume a normal operating state for semiconductor chip fabrication advantageously increases its efficiency and throughput capacity.

Some optional features of the invention have been defined in the dependent claims.

For instance, the step of position sensor determining the position of the bonding tool may comprises an encoder measuring a height of the bonding tool with respect to a reference level. In addition, the step of the bonding apparatus detecting the bonding failure may comprise the bonding apparatus comparing the measured height of the bonding tool against a corresponding height of the bonding tool with respect to the same reference level and relating to an immediately preceding electrical connection in which wire bonding with the substrate has been successful, and detecting a difference between them. As the semiconductor chip would be detached from the substrate to obstruct between the bonding tool and the substrate if the semiconductor chip has not been properly adhered to the substrate, the position of the bonding tool when in contact with a surface to bond the wire to the substrate would be different from the corresponding bonding tool position that has allowed the bonding tool to successfully perform the preceding electrical connection. Thus, such a method advantageously provides a convenient way of detecting the bonding failure due to detachment of the semiconductor chip.

In addition, the bonding apparatus may further include an electrode for generating an electric discharge, and the step of the bonding apparatus detaching the semiconductor chip from the wire may comprise the electrode directing the electric discharge towards the semiconductor chip to break the wire. For instance, a portion of the bonding wire broken by the electric discharge may be a bond between the bonding tool and the semiconductor chip.

Typically, the electrode is used for generating an electric discharge to form a free air ball for bonding with the substrate. By using the same electrode for detaching the semiconductor chip from the wire, the functionality of the electrode may advantageously be enhanced. Moreover, by not having an additional component to detach the semiconductor chip in the bonding apparatus, construction of the bonding apparatus may be simplified.

Further, the method of recovering the bonding apparatus may additionally comprise the step of the bonding apparatus repositioning the bonding tool with respect to an original position of the detached semiconductor chip on the substrate, before the semiconductor chip is detached from the wire. In this way, the bonding apparatus may require lesser time and undergo lesser motion to reposition the bonding tool before separating the semiconductor chip from the wire, compared with the case in which the bonding tool is repositioned at a portion of the substrate specifically designated to receive the detached semiconductor chip, before separating the semiconductor chip from the wire. Thus, the throughput capacity of the bonding apparatus may advantageously be improved.

Moreover, the method of recovering the bonding apparatus may additionally comprise some or all of the steps of: i) the bonding apparatus bonding the wire to the substrate after the semiconductor chip has been detached from the wire; ii) the bonding apparatus using a plurality of clamps to automatically thread the wire through the bonding tool; iii) and the bonding apparatus detecting an absence of a wire bond between the wire and the substrate before detecting the bonding failure due to detachment of the semiconductor chip from the substrate.

A second aspect of the invention is a computer readable medium containing program instructions for performing the method of recovering the bonding apparatus from the bonding failure to resume a normal operating state for semiconductor fabrication as described above.

A third aspect of the invention is a method of recovering a bonding apparatus during a bonding failure to resume a normal operation state for semiconductor chip fabrication. The bonding apparatus is capable of bonding a wire between a semiconductor chip and a substrate, and comprises an electrode for generating an electric discharge. Specifically, the method comprises the steps of: the bonding apparatus detecting a bonding failure caused by detachment of the semiconductor chip from the substrate; and the bonding apparatus detaching the semiconductor chip from the wire by directing the electric discharge generated by the electrode towards the semiconductor chip to break the bonding wire.

Some optional features have also been defined in the dependent claims.

BRIEF DESCRIPTION OF THE DRAWINGS

Embodiments of the invention will now be described, by way of example only, with reference to the accompanying drawings, of which.

DETAILED DESCRIPTION OF THE PREFERRED EMBODIMENTS

Figure 1:
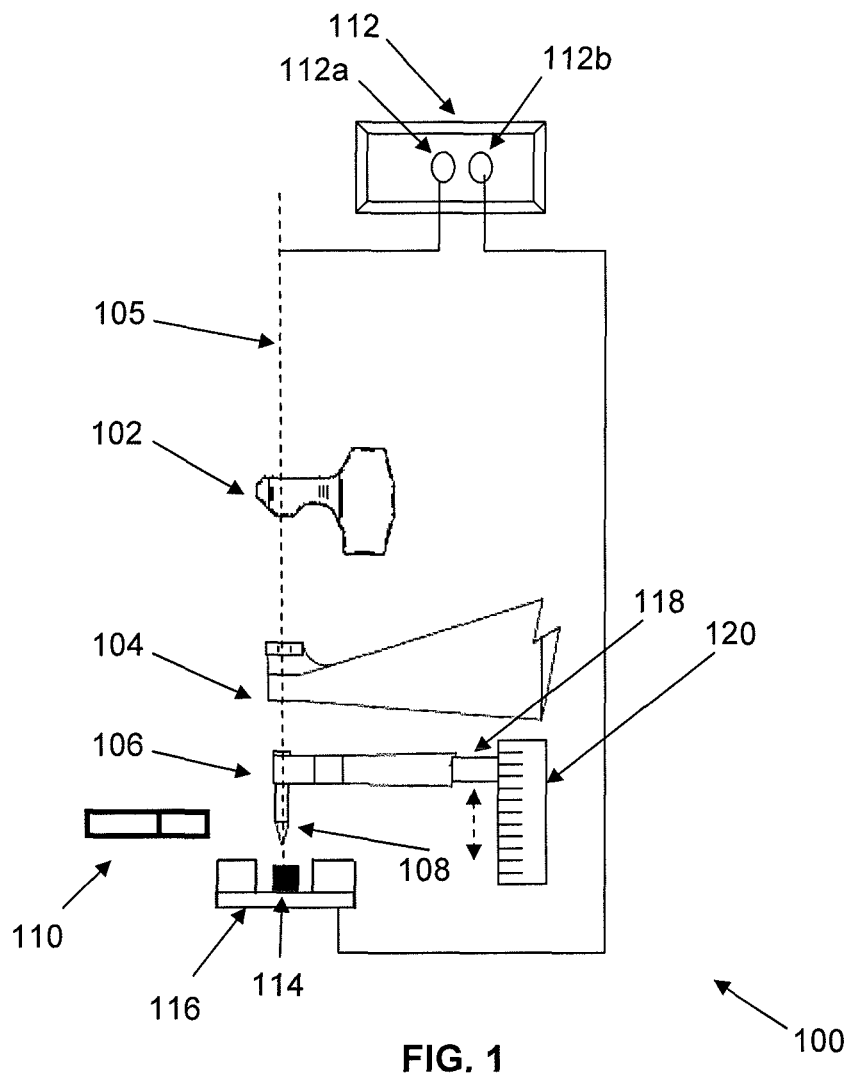
FIG. 1 shows a bonding apparatus for performing wire bonding.

FIG. 1 shows a bonding apparatus 100 for performing wire bonding. The bonding apparatus 100 comprises: i) an upper clamp 102 and a lower clamp 104 for controlling the movement of a bonding wire 105 fed from a wire spool (not shown) along a wire-feeding path; iii) a transducer horn 106 for producing ultrasonic vibrations during wire bonding; iv) a bonding tool (shown in FIG. 1 as capillary 108) through which the bonding wire 105 is fed during wire bonding; v) an electronic flame-off torch 110 for generating an electric discharge to create a free air ball at a tail end of the bonding wire 105; vi) a contact sensor 112 responsive to contact between objects; and vii) a position sensor (shown in FIG. 1 as an encoder 118) movable relative to a linear scale 120 to determine and measure a position of the capillary 108.

Before bonding the free air ball of the bonding wire 105 to a semiconductor chip 114 on a substrate (shown in FIG. 1 as a leadframe 116), the contact sensor 112 cooperates with the upper and lower clamps 102, 104 to ensure a proper wire tail length of the bonding wire 105. First, the bonding apparatus 100 ensures that the upper clamp 102 is opened and the lower clamp 104 is closed to clamp the bonding wire 105. Secondly, the contact sensor 112 is electrically connected between the bonding wire 105 and an electrically-conductive top surface of the semiconductor chip 114. Accordingly, an electrical circuit is formed by such an arrangement—that is, a closed electrical circuit is formed when the bottom tip of the bonding wire 105 contacts the top surface of the semiconductor chip 114, and an open electrical circuit is formed when such a contact is absent. Thus, the contact sensor 112 is responsive to contact between the bottom tip of the bonding wire 105 and the top surface of the semiconductor chip 114.

As the lower clamp 104 is successively lowered from a reference level towards the semiconductor chip 114, a processor of the bonding apparatus 100 measures the distance as moved by the lower clamp 104 from its reference level until the bottom tip of the bonding wire 105 contacts the top surface of the semiconductor chip 114, whereupon the contact sensor 112 detects a closed electrical circuit between the bonding wire 105 and the top surface of the semiconductor chip 114. After the wire tail length is measured, the lower clamp 104 is then raised back to its reference level.

By measuring the distance gap between the bottom tip of the bonding wire 105 and the top surface of the semiconductor chip 114, a positive or negative offset of the current wire tail of the bonding wire 105 from a desired wire tail length can be derived by the processor of the bonding apparatus 100. This is done by comparing the measured distance gap against a desired distance gap pre-stored in the processor memory of the bonding apparatus 100.

If an additional length of the bonding wire 105 is required to be extended from the wire spool to increase the current length of the wire tail length, the upper clamp 102 remains open while the lower clamp 104 remains close and is successively lowered from its reference level in a direction towards the semiconductor chip 114 to pull the bonding wire 105 from the wire spool by the additional length required. The upper clamp 102 is then closed, while the lower clamp 104 is opened before returning to its reference level and re-closing again. Thereafter, the upper clamp 102 re-opens again. Accordingly, the current wire tail of the bonding wire 105 is extended by the required additional length to provide the desired wire tail length for ball bonding with the semiconductor chip 114. The cooperation between the upper and lower clamps 102, 104 thus prevents the bonding wire 105 from deviating from the wire-feeding path, and advantageously ensures accuracy of the wire bonding operation.

On the other hand, if a length of the bonding wire 105 is required to be retracted to decrease the current length of the wire tail length, the lower clamp 104 will be raised from its reference level in an opposite direction away from the semiconductor chip 114. The upper clamp 104 is then closed, while the lower clamp 104 is opened before being lowered back to its reference level and re-closing again. Thereafter, the upper clamp 102 re-opens again. Accordingly, the current wire tail of the bonding wire 105 is retracted by the required length to provide the desired wire tail length for ball bonding with the semiconductor chip 114. Again, the cooperation between the upper and lower clamps 102, 104 prevents the bonding wire 105 from deviating from the wire-feeding path, and advantageously ensures accuracy of the wire bonding operation.

After the proper wire tail length of the bonding wire 105 is set in place, the electronic flame-off torch 110 directs an electrical discharge at the tail end of the bonding wire 105 to create a free air ball for electrically connecting the bonding wire 105 with a semiconductor chip 114 on the leadframe 116 via ball bonding.

Figures 2A, 2B, 2C:
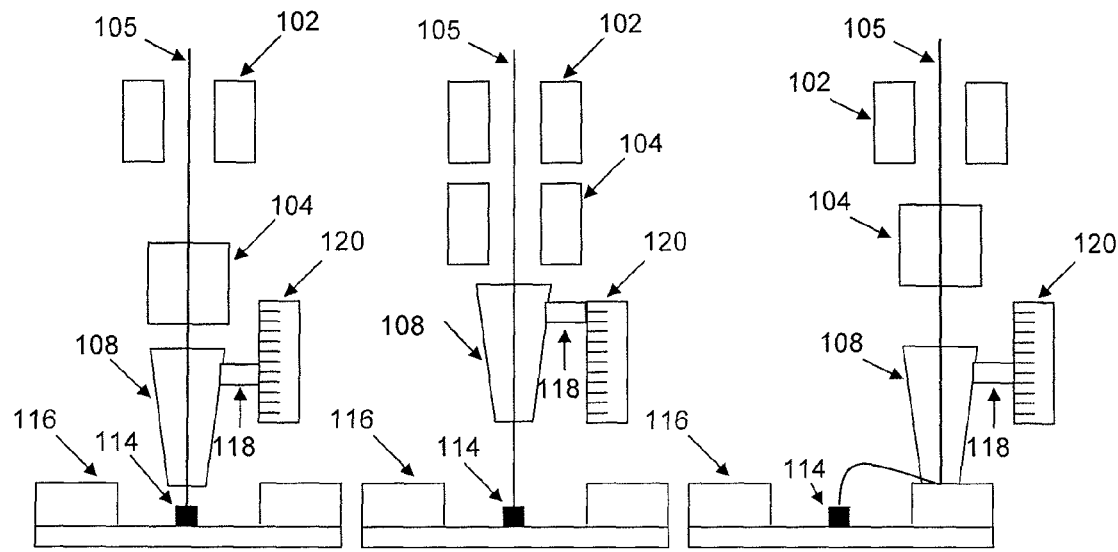
FIGS. 2a-2c show the steps of wire bonding performed by the bonding apparatus of FIG. 1.

FIGS. 2a-2c show the sequence of steps for forming an electrical wire interconnection between the semiconductor chip 114 and the leadframe 116.

FIG. 2a shows the bonding wire 105 being bonded to the semiconductor chip 114 via ball bonding. Specifically, both the lower clamp 104 and the capillary 108 are lowered from their respective reference levels in a direction towards the semiconductor chip 114 to a level at which the bottom tip of the bonding wire 105 contacts the top surface of the semiconductor chip 114. It should be noted that as the capillary 108 is being successively lowered from its reference level towards the semiconductor chip 114, the encoder 118 also moves together with the capillary 108 relative to the linear scale 120. Thus, the encoder 118 is capable of measuring a Z-level (or height) of the capillary 108 as it moves upward and downward relative to the linear scale 120 during the bonding process.

After the ball bond is formed on the semiconductor chip 114, the lower clamp 104 opens and lifts towards the upper clamp 102 together with the capillary 108, as shown in FIG. 2b. Thereafter, the lower clamp 104 re-closes and moves sideways to the right of the semiconductor chip 114, together with the upper clamp 102 and the capillary 108, before they are lowered towards an electrically-conductive bonding position on the leadframe 116 to form a wire loop extending from the ball bond, as shown in FIG. 2c.

Specifically, the capillary 108 is again successively lowered from its reference level towards the bonding position on the leadframe 116. As the capillary 108 is successively lowered, the encoder 118 again moves together with the capillary 108 relative to the linear scale 120, to measure the Z-level or height of the bottom tip of the capillary 108 just as it contacts the bonding position on the leadframe 116. This height of the capillary 108 is recorded in the processor memory of the bonding apparatus 100. The bonding wire 105 is subsequently wedge-bonded by the capillary 108 at the bonding position on the leadframe 116 to complete the electrical wire interconnection between the semiconductor chip 114 and the leadframe 116.

Figure 2D:
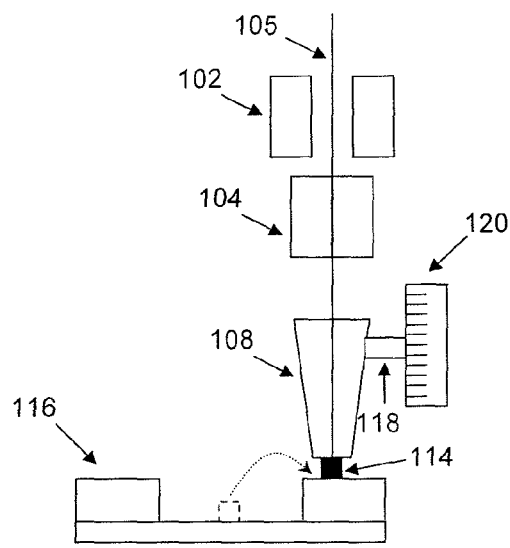
FIG. 2d shows a semiconductor chip detached from the substrate during a step of wire bonding as shown in FIG. 2c.

In the event that the semiconductor chip 114 has not been properly adhered to the leadframe 116 via an adhesive die attach material such as epoxy, the semiconductor chip 114 would detach from the leadframe 116 either during the sideways motion of the upper and lower clamps 102, 104 and the capillary 108, or during the downward motion of the lower clamp 104 and the capillary 108 towards the leadframe 116 when the bonding apparatus 100 performs wedge bonding with the leadframe 116. If so, the semiconductor chip 114 would be lifted away from its original position on the leadframe 114 to obstruct between the capillary 108 and the leadframe 116, and prevent the bonding apparatus 110 from forming the wedge bond between the semiconductor chip 114 and the leadframe 116, as shown in FIG. 2d. This results in a bonding failure of the bonding apparatus 100.

In order to recover the bonding apparatus 100 from the bonding failure without requiring human assistance, the bonding apparatus 100 has to be configured to perform or execute a recovery program comprising a series of steps whenever bonding between the bonding wire 105 and the leadframe 106 takes place.

Figure 3:
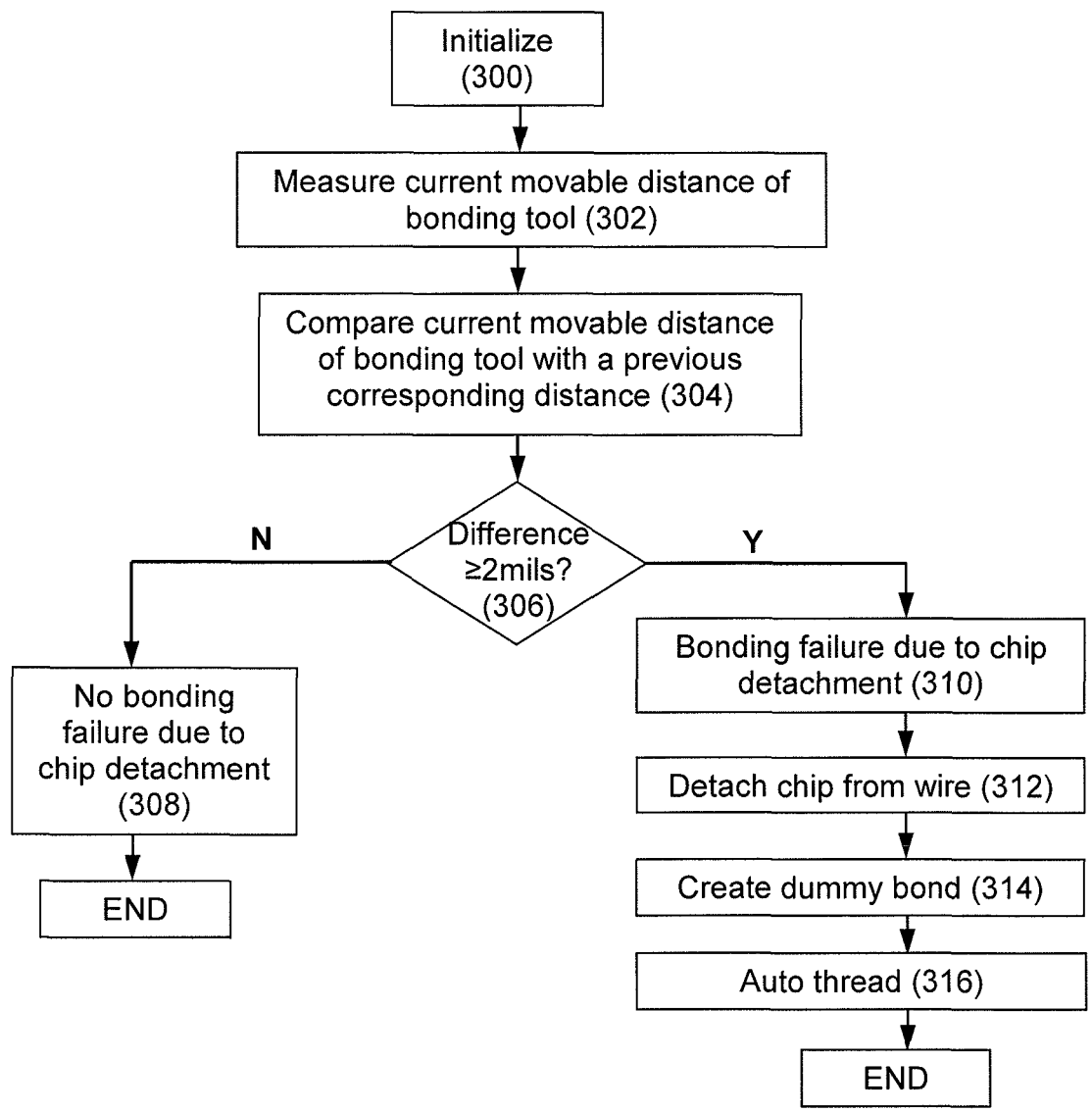
FIG. 3 is a flow chart showing the steps of recovering the bonding apparatus of FIG. 1 from a bonding failure to resume a normal operating state for semiconductor chip fabrication according to an embodiment of the invention.

FIG. 3 is a flow chart showing the steps of the recovery program that is activated each time the bonding apparatus 100 performs bonding with the leadframe 116. In the event of a bonding failure due to detachment of the semiconductor chip 114 from the leadframe 116, the recovery program allows the bonding apparatus 100 to recover from the bonding failure. It should be appreciated that the processor memory of the bonding apparatus 100 may store the recovery program, which comprises the program instructions for recovering the bonding apparatus from the bonding failure, as will be described below.

The recovery sequence first includes a step of initializing 300 the bonding apparatus 100. This may include the step of ensuring the various components of the bonding apparatus 100 are accurately positioned along their respective reference levels prior to the bonding of the bonding wire 105 with the leadframe 116.

Next, the recovery program instructs the encoder 114 to perform the step of determining a position of the capillary 108 when the bottom tip of the capillary 108 (and hence the bonding wire 105) contacts a surface to bond the bonding wire 105 to the leadframe 116. In particular, this involves the encoder 118 measuring 302 a Z-level or height of the bottom tip of the capillary 108 just when it contacts the surface to bond the bonding wire 105 to the leadframe 116.

It should be noted that whenever the bonding apparatus 100 performs successful bonding between the bonding wire 105 and the leadframe 116, the Z-level (or height) of the bottom tip of the capillary 108 in contact with the bonding surface of the leadframe 116 as measured by the encoder 118 is recorded in the processor memory of the bonding apparatus 100. Preferably, the measured height of the capillary 108 is overwritten by a newly-measured height of the capillary 108 in relation to a successful electrical connection performed on a subsequent semiconductor die. In this way, the recovery program does not impose any memory constraint on the processor of the bonding apparatus 110. Nevertheless, it should be appreciated that the processor memory of the bonding apparatus 110 may also be configured to store all of the measured heights of the capillary 108, or at least some of its latest heights measured.

The recovery program then instructs the bonding apparatus 100 to perform the step of comparing 304 the measured height of the capillary 108 against a previously-measured height of the capillary 108 relating to the immediately preceding electrical connection in which bonding with the leadframe 116 has been successful. Thereafter, the bonding apparatus 100 performs the step of determining 306 the difference of the two heights of the capillary 108.

If their absolute difference is less than 2 mils (i.e. about 0.001 inch or 25.4 microns), the bonding apparatus 100 would detect 308 an absence of a bonding failure due to detachment of the semiconductor chip 114. Otherwise, the bonding apparatus 100 would detect 310 a presence of such a bonding failure. This is because the thickness of semiconductor chips is typically around 2 mils and any semiconductor chip that is lifted away from its original position on the leadframe 114 during bonding would likely cause an obstruction between the capillary 108 and the leadframe 116 to prevent the bonding apparatus 110 from operating. An example of the bonding failure is shown FIG. 2d. Of course, it should be appreciated that depending on the thickness of the semiconductor chips involved in the bonding process, the bonding apparatus 100 may also detect the bonding failure based on absolute heights differences of values besides 2 mils.

If the recovery program detects 308 an absence of the bonding failure due to detachment of the semiconductor 114, it accordingly ends. However, if the recovery program detects 310 the presence of such a bonding failure, it accordingly instructs the bonding apparatus 100 to perform the step of detaching 312 the semiconductor chip 114 from the bonding wire 105.

Figure 4A:
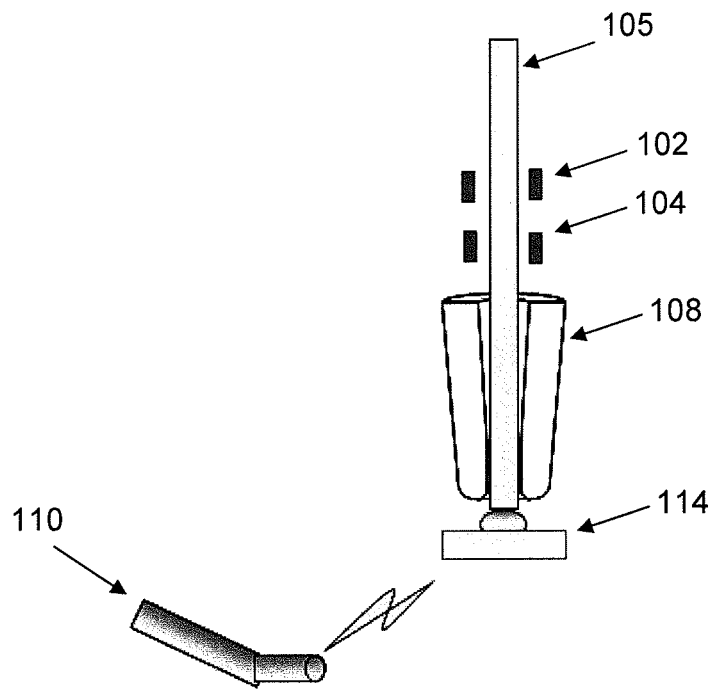
FIGS. 4a and 4b show an operation of an electronic flame-off torch in the bonding apparatus of FIG. 1 for separating the detached semiconductor chip from a bonding wire to recover the bonding apparatus of FIG. 1 from a bonding failure.
Figure 4B:
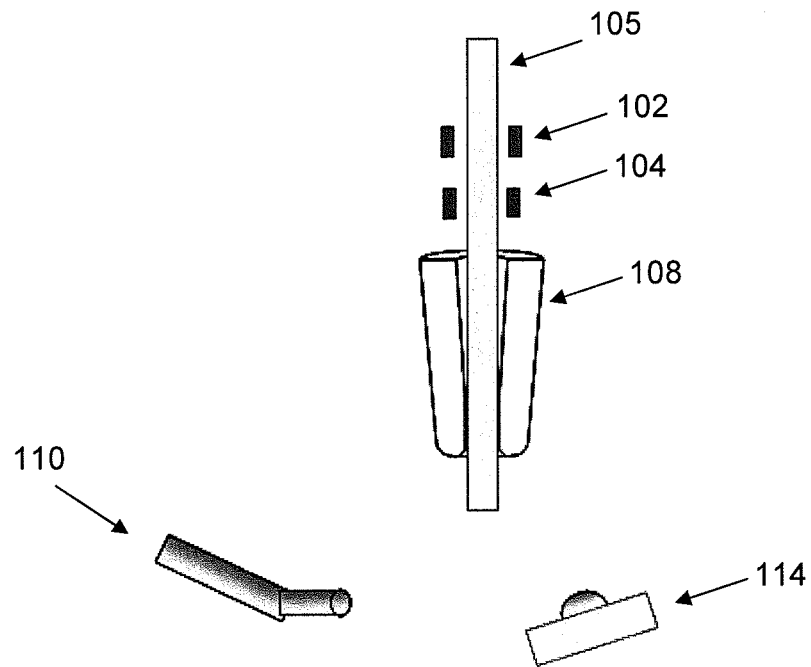

FIGS. 4a and 4b show an operation of the electronic flame-off torch 110 for separating the detached semiconductor chip from a bonding wire to recover the bonding apparatus of FIG. 1 from the bonding failure. Specifically, FIG. 4a shows the capillary 108 being repositioned with respect to the electronic flame-off torch 110. During the normal course of operation, the detached semiconductor die 114 will likely be pushed by air flowing in an upwards direction in the bonding apparatus 100 against the bottom tip of the capillary 108, especially if the upper and lower clamps 102, 104 are both opened.

The electronic flame-off torch 110 then generates an electric discharge in the form of a high voltage spark towards the semiconductor chip 114. With both the bonding wire 105 and the electronic flame-off torch 110 being electrically grounded and the semiconductor chip 114 acting as a conductive PN-junction, a complete electrical circuit is thereby formed among the semiconductor chip 114, the electronic flame-off torch 110 and the bonding wire 105, when the high voltage electric spark is generated. The high current flow across the electrical circuit due to the high voltage electric spark accordingly generates heat along the bonding wire 105 in a "fuse-like" effect to melt and break a portion of the bonding wire 105 next to the detached semiconductor chip 114, and thereby detaching the semiconductor chip 114 from the bonding wire 105 as shown in FIG. 4b. In particular, the portion of the bonding wire 105 that breaks when the high voltage electric spark is generated is the bond (for example, a ball bond) of the bonding wire 105 that contacts the semiconductor chip 114. This is because the bond of the bonding wire 105 has the weakest mechanical strength along the bonding wire 105. Further, the portion of the bonding wire 105 that breaks may be the intermetallic layers formed by the contact between the bonding wire 105 and the semiconductor chip 114.

Typically, the electronic flame-off torch 110 is used for generating an electric discharge to form a free air ball at the tail end of the bonding wire 105 for ball bonding with the leadframe 116. By using the same electronic flame-off torch 110 to allow the detached semiconductor chip 114 to break away from the bonding wire 105 through a fuse-like effect, the functionality of the electronic flame-off torch 110 may advantageously be enhanced. Moreover, by not having an additional component for detaching the semiconductor chip 114 in the bonding apparatus 100, construction of the bonding apparatus 100 may advantageously be simplified.

Preferably the capillary 108 is repositioned above an original position of the detached semiconductor chip 114 on the leadframe 116 before the electronic flame-off torch 110 discharges the high voltage and current spark. By repositioning the capillary 108 in this way, it may require lesser time and undergo lesser motion to reposition the capillary 108 before separating the detached semiconductor chip 114 from the bonding wire 105, compared with the case in which the capillary 108 is repositioned to a portion of the leadframe 116 specifically designated to receive the detached semiconductor chip 114. Thus, the throughput capacity of the bonding apparatus 100 may advantageously be improved.

The bonding apparatus 100 is then instructed by the recovery program to perform the step of creating 314 a dummy bond. The capillary 108 may be moved to a designated area of the leadframe 116 for creating dummy bonds. First, the electronic flame-off torch 110 directs an electric discharge at the wire tail of the bonding wire 105 to create a free air ball for connecting to the designated area of the leadframe 116 via ball bonding. The capillary 108 then connects the bonding wire 105 with a second bonding position within the designated area of the leadframe 116 via wedge bonding. Finally, the bonding wire 105 is broken off form the wedge bond and a new wire tail is formed.

Before the wire bonding operation can continue smoothly, the recovery program instructs the bonding apparatus 100 to perform the step of auto-threading 316 of the bonding wire 105 to ensure that a proper wire tail length of the bonding wire 105. The step of auto-threading 320 of the bonding wire 105 is the same as the threading operation performed prior to wire bonding, as has been described above. After the step of auto-threading 320 is completed, the bonding apparatus 100 can then resume its normal operating state for wire bonding.

It should be appreciated that other embodiments of the method of recovering the bonding apparatus 100 to its normal operating state for semiconductor chip fabrication are also possible without departing from the scope of the present invention. For instance, the recovery sequence may further include the step of detecting a 'Non-stick on Lead' (NSOL) condition, before the bonding apparatus 100 detects the presence of a bonding failure due to detachment of the semiconductor chip 114 from the leadframe 116. The NSOL condition relates to a type of bonding failure, in which bonding has not been properly performed between the bonding wire 105 and the leadframe 116. One way of determining the presence of the NSOL condition is by determining the nature of an electrical circuit formed between the bonding wire 105 and the leadframe 116 after bonding is completed—if the electrical circuit is closed, it would indicate that bonding has been properly formed, and thus, an absence of the NSOL condition; otherwise, it would indicate that bonding has not been properly performed, and thus, a presence of the NSOL condition. If the NSOL condition is detected, the recovery program may then instruct the bonding apparatus 100 to perform the step of comparing 304 the measured height of the capillary 108 against a corresponding height of the capillary 108 relating to an immediately preceding electrical connection in which bonding with the leadframe 116 has been successful, to detect the presence of a bonding failure due to detachment of the semiconductor chip 114 from the leadframe 116.

Other types of position sensors may also be used in place of the encoder 108, as long as they are capable of determining a position of the capillary 108 when in contact with a surface to bond the bonding wire 105 to the leadframe 116. For example, the position sensor may be an imaging device for imaging the position of the capillary 108 in contact with a surface for bonding the bonding wire 105 to the leadframe 116. In this case, the bonding apparatus 100 may be configured to compare the captured image of the capillary 108 against a template image stored in its processor memory to detect a bonding failure due to detachment of the semiconductor chip 114 from the leadframe 116 during bonding.

The invention claimed is:

1. A method of recovering a bonding apparatus during a bonding failure to resume a normal operating state for semiconductor chip fabrication, the bonding apparatus having a bonding tool for bonding a wire between a semiconductor chip and a substrate, and a position sensor, the method comprising the steps of:

the position sensor determining a position of the bonding tool when the bonding tool contacts a surface to bond the wire to the substrate;

the bonding apparatus detecting a bonding failure caused by detachment of the semiconductor chip from the substrate based on the position of the bonding tool; and the bonding apparatus detaching the semiconductor chip from the wire.

2. The method of claim 1, wherein the step of the position sensor determining the position of the bonding tool comprises an encoder measuring a height of the bonding tool with respect to a reference level.

3. The method of claim 2, wherein the step of the bonding apparatus detecting the bonding failure comprises the bonding apparatus comparing the measured height of the bonding tool against a corresponding height of the bonding tool with respect to the reference level in relation to an immediately preceding electrical connection in which bonding of the wire with the substrate has been successful.

4. The method of claim 3, wherein the step of the bonding apparatus detecting the bonding failure comprises the bonding apparatus detecting a difference between the measured height of the bonding tool and the corresponding height of the bonding tool relating to the immediately preceding electrical connection that equals or exceeds 2 mils.

5. The method of claim 1, wherein the bonding apparatus further comprises an electrode for generating an electric discharge, the step of the bonding apparatus detaching the semiconductor chip from the wire comprises the electrode directing the electric discharge towards the semiconductor chip to melt and break a portion of the bonding wire connected to the chip.

6. The method of claim 1, wherein a portion of the bonding wire broken by the electric discharge is a bond between the bonding tool and the semiconductor chip.

7. The method of claim 1, further comprising the step of the bonding apparatus repositioning the bonding tool with respect to an original position of the detached semiconductor chip on the substrate, before detaching the semiconductor chip from the wire.

8. The method of claim 1, further comprising the step of the bonding apparatus bonding the wire to the substrate after the semiconductor chip has been detached from the wire.

9. The method of claim 1, wherein the bonding apparatus further comprises a plurality of clamps, the method further comprising the step of the bonding apparatus using the plurality of clamps to automatically thread the wire through the bonding tool.

10. The method of claim 1, further comprising the step of the bonding apparatus detecting a wire bond between the wire and the substrate before detecting the bonding failure due to detachment of the semiconductor chip from the substrate.

11. The method of claim 10, wherein the bonding apparatus detects an absence of the wire bond if an electrical connection between the bonding tool and the substrate is open, and the bonding apparatus detects a presence of the wire bond if the electrical connection between the bonding tool and the substrate is closed.

12. A non-transient computer readable medium containing program instructions for performing the method of claim 1.

13. A method of recovering a bonding apparatus during a bonding failure to resume a normal operation state for semiconductor chip fabrication, the bonding apparatus being for bonding a wire between a semiconductor chip and a substrate, and the bonding apparatus comprising an electrode for generating an electric discharge, the method comprising the steps of:

the bonding apparatus detecting a bonding failure caused by detachment of the semiconductor chip from the substrate; and the bonding apparatus detaching the semiconductor chip from the wire by directing the electric discharge generated by the electrode towards the semiconductor chip to break the bonding wire.

14. The method of claim 13, wherein a portion of the bonding wire broken by the electric discharge is a bond between the bonding tool and the semiconductor chip.

15. The method of claim 13, further comprising the step of the bonding apparatus repositioning the bonding tool with respect to an original position of the detached semiconductor chip on the substrate, before detaching the semiconductor chip from the wire.

* * * * *